United States Patent [19]
Floyd et al.

[11] Patent Number: 6,069,043
[45] Date of Patent: May 30, 2000

[54] METHOD OF MAKING PUNCH-THROUGH FIELD EFFECT TRANSISTOR

[75] Inventors: Brian H. Floyd, Sunnyvale; Fwu-Iuan Hshieh, Saratoga; Mike F. Chang, Cupertino, all of Calif.

[73] Assignee: Siliconix incorporated, Santa Clara, Calif.

[21] Appl. No.: 08/962,885

[22] Filed: Nov. 12, 1997

Related U.S. Application Data

[63] Continuation of application No. 08/784,465, Jan. 16, 1997, abandoned, which is a continuation of application No. 08/461,194, Jun. 5, 1995, abandoned, which is a continuation of application No. 08/415,009, Mar. 31, 1995, Pat. No. 5,592,005.

[51] Int. Cl.$^7$ .................................................. H01L 21/336
[52] U.S. Cl. .......................... 438/270; 438/138; 438/587; 438/589
[58] Field of Search ........................ 437/40 DM, 41 DM; 438/270, 268, 271, 272, 589, 138, 587

[56] References Cited

U.S. PATENT DOCUMENTS

| | | | |
|---|---|---|---|
| 4,633,292 | 12/1986 | Fellinger et al. | 257/630 |
| 4,941,026 | 7/1990 | Temple | 257/333 |
| 5,023,196 | 6/1991 | Johnsen et al. | 437/40 RG |
| 5,072,276 | 12/1991 | Malhi et al. | 257/372 |
| 5,082,795 | 1/1992 | Temple | 437/203 |
| 5,233,215 | 8/1993 | Baliga | 257/490 |
| 5,298,442 | 3/1994 | Bulucea et al. | 437/203 |
| 5,316,959 | 5/1994 | Kwan et al. | 437/203 |
| 5,349,224 | 9/1994 | Gilbert et al. | 437/203 |
| 5,378,911 | 1/1995 | Murakami | 257/407 |
| 5,405,794 | 4/1995 | Kim | 437/41 DM |
| 5,430,315 | 7/1995 | Rumennik | 257/331 |
| 5,468,982 | 11/1995 | Hshieh et al. | 437/67 |

FOREIGN PATENT DOCUMENTS 6-252408   9/1994   Japan .

OTHER PUBLICATIONS

PATENT ABSTRACTS OF JAPAN –Publication No. 06–252408, published 09/09/94, *abstract and figure*.
Patent Abstracts of Japan—vol. 017, No. 050 (E–1314), Jan. 29, 1993 & JP 04 264776 A (Toshiba Corp), Sep. 21, 1992, *abstract figures*.

(List continued on next page.)

Primary Examiner—Michael Trinh
Attorney, Agent, or Firm—Skjerven, Morrill, MacPherson, Frankling & Friel; Norman R. Klivans

[57] ABSTRACT

A trenched field effect transistor suitable especially for low voltage power applications provides low leakage blocking capability due to a gate controlled barrier region between the source region and drain region. Forward conduction occurs through an inversion region between the source region and drain region. Blocking is achieved by a gate controlled depletion barrier. Located between the source and drain regions is a fairly lightly doped body region. The gate electrode, located in a trench, extends through the source and body regions and in some cases into the upper portion of the drain region. The dopant type of the polysilicon gate electrode is the same type as that of the body region. The body region is a relatively thin and lightly doped epitaxial layer grown upon a highly doped low resistivity substrate of opposite conductivity type. In the blocking state the epitaxial body region is depleted due to applied drain-source voltage, hence a punch-through type condition occurs vertically. Lateral gate control increases the effective barrier to the majority carrier flow and reduces leakage current to acceptably low levels.

14 Claims, 9 Drawing Sheets

OTHER PUBLICATIONS

Mader, H., "Electrical Properties of Bulk–Barrier Diodes," *IEEE Transactions on Electron Devices*, vol. ED–29, No. 11, Nov. 1982, pp. 1766–1771.

Mader, H., et al., "Bulk–Barrier Transistor," *IEEE Transactions on Electron Devices*, vol. ED–30, No. 10, Oct. 1983, pp. 1380–1386.

McCowen, A., et al., "Gate controlled bulk–barrier mechanism in an MOS power transistor," *IEEE Proceedings*, vol. 134, Pt. I, No. 6, Dec. 1987, pp. 165–169.

Baliga, B., et al., "The Accumulation–Mode Field–Effect Transistor: A New Ultralow On–Resistance MOSFET," *IEEE Electron Device Letters*, vol. 13, No. 8, Aug. 1992, pp. 427–429.

Syau, T., et al., "Comparison of Ultralow Specific On–Resistance UMOSFET Structures: The ACCUFET, EXTFET, INVFET, and Conventional UMOSFET's," *IEEE Transactions on Electron Devices*, vol. 41, No. 5, May 1994, pp. 800–808.

METHOD OF MAKING PUNCH-THROUGH FIELD EFFECT TRANSISTOR

This application is a continuation of application Ser. No. 08/784,465, Jan. 16, 1997 abandoned, which is a continuation of application Ser. No. 08/461,194, filed Jun. 5, 1995 now abandoned, which is a continuation of application Ser. No. 08/415,009, filed Mar. 31, 1995, now U.S. Pat. No. 5,592,005.

BACKGROUND OF THE INVENTION

1. Field of the Invention

This invention relates to semiconductor devices and more particular to a trenched field effect transistor especially suitable for low voltage switching applications.

2. Description of the Prior Art

Field effect transistors (FETs) are well known, as are metal oxide semiconductor field effect transistors (MOSFETs); such transistors are often used for power applications. There is a need for power transistors for relatively low voltage applications, i.e. typically under 50 volts, that have low current leakage blocking capability.

Figure 1:
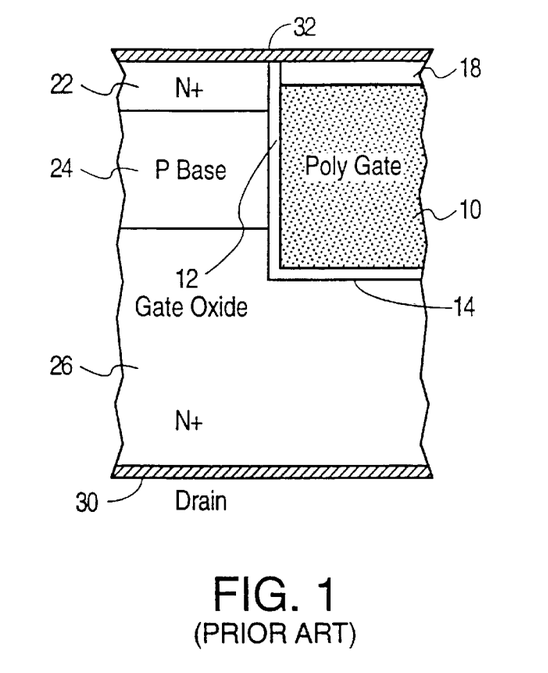
FIG. 1 shows a prior art INVFET.

Examples of trench field effect transistors suitable for such applications are disclosed in "Comparison of Ultra Low Specific On Resistance UMOSFET Structures. . ." by Syau et al., *IEEE Transactions on Electron Devices*, Vol. 41, No. 5, May 1994. Inter alia, this publication describes the so-called INVFET structure of present FIG. 1, which corresponds to FIG. 1(*b*) of the publication. Present FIG. 1 shows only a portion of a single transistor including the polysilicon (polycrystalline silicon) gate electrode 10 which in this case is N-type polysilicon which is insulated by a gate oxide layer 12 on its sides and bottom in a trench 14 and insulated on its top side by an oxide layer 18. The trench 14 extends through the N+ doped source region 22 through the P doped base region 24 and into the N+ doped drain region 26. The drain electrode 30 is formed on the underside of the drain region 26 and the source electrode 32 formed on the top side of the source region.

Figure 2:
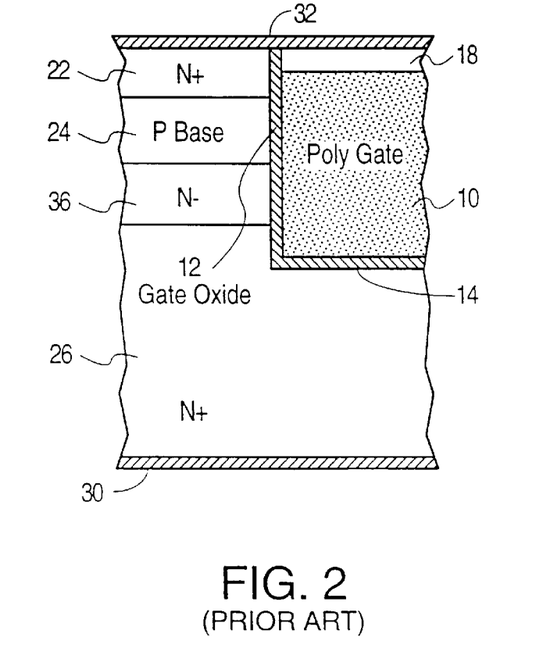
FIG. 2 shows a prior art EXTFET.

Also described in FIG. 1(*c*) of this article and shown here in present FIG. 2 is the somewhat similar so-called EXTFET which is identical to the INVFET except for having an additional N− doped drift region 36 formed underlying the P doped base region 24. For both of these devices the P base region 24 is formed by diffusion (hence does not exhibit uniform doping) and is fairly heavily doped. It is believed that a typical surface concentration of the P base region 24 is $10^{17}$/cm$^3$.

These devices are both intended to avoid full depletion of the P base (body) region 24. They each have the gate electrode 10 doped to the same conductivity type as is the drain region 26 (i.e. N type) as shown in FIGS. 1 and 2. The "mesa" width, i.e. the width of the source region between two adjacent trenches, is typically 3 μm and a typical cell pitch for an N-channel device is about 6 μm. Blocking is accomplished by a quasi-neutral (undepleted) PN junction at a V$_{gs}$ (gate source voltage) of zero. The ACCUFET (see Syau et al. article) offers the best specific on resistance at the expense of poor blocking capability, while the INVFET and EXTFET offer improved blocking at the expense of increased specific on resistance.

As is well known, a power MOSFET should have the lowest possible on-state specific resistance in order to minimize conduction losses. On-state resistance is a well known parameter of the efficiency of a power transistor and is the ratio of drain-to-source voltage to drain current when the device is fully turned on. On-state specific resistance refers to resistance times cross sectional area of the substrate carrying the drain current.

However, these prior art devices do not provide the optimum low on-state specific resistance in combination with blocking state low current leakage.

SUMMARY

This disclosure is directed to a MOS semiconductor device suitable especially for low voltage power application where low leakage blocking capability is desirable. In accordance with the invention, the off-state blocking of a trenched field effect transistor is achieved by a gate controlled barrier region between the source and drain. Similar to the above described INVFET, forward conduction occurs through an inversion region between the source and the drain (substrate). Unlike the INVFET, however, blocking is achieved by a gate controlled depletion barrier and not by a quasi-neutral PN junction. The depletion barrier is formed and controlled laterally and vertically so as to realize the benefits of ultra-low on-state specific resistance combined with the low current leakage blocking. Advantageously, this structure is relatively easily fabricated and has blocking superior to that of prior art ACCUFET devices, with low leakage current at zero applied gate-source voltage. Moreover, in the blocking state there is no quasi-neutral PN junction, and therefore, like the ACCUFET, this structure offers the advantage of containing no parasitic bipolar PN junction.

The present device's on-state specific resistance is comparable to that of the ACCUFET, and like the ACCUFET offers on-state specific resistance superior to that of the INVFET and EXTFET as described in the above mentioned article by Syau et al.

In an N-channel embodiment of the present invention, an N+ drain region underlies a lightly doped P− body region which is overlain by an N+ source region. The body region is formed by lightly doped epitaxy with uniform or almost uniform doping concentration, typically in a range of $10^{14}$ to $10^{16}$/cm$^3$. The gate electrodes are formed in trenches which extend through the source region, through the body region, and partially into the drain (substrate) region. Alternatively, the gate electrodes do not extend into the drain region. The polysilicon gate electrodes themselves are P doped, i.e. having a doping type the same as that of the body region. Additionally, the mesas (holding the source regions) located between adjacent gate electrode trenches are less than 1.5 μm wide, and the cell pitch is less than 3 μm.

Advantageously in the blocking state the epitaxial P body region is depleted due to the applied drain-source bias V$_{ds}$, and hence a punch-through type condition occurs vertically. However, lateral gate control combined with the narrow mesa width (under 1.5 μm) increases the effective depletion barrier to majority carrier flow and prevents conduction. Thus, the present device is referred to herein as the PT-FET for "punch-through field effect transistor".

Thus the blocking characteristics are determined by barrier-limited majority-carrier current flow and not by avalanche breakdown. In accordance with the invention, a complementary P-channel device is implemented and has advantages comparable to those of the above described N-channel device.

The above described embodiment has a floating body region, thus allowing bidirectional operation. In another embodiment a body contact region is provided extending into the body region from the principal surface of the semiconductor structure, thus allowing a source region to body region short via the source metallization for forward blocking-only applications.

Thus advantageously the present PT-FET has a fully depleted (punch-through) lightly doped body region at a small applied drain-source voltage. This differs from the P body region in the above described INVFET and EXTFET which must, by design, be undepleted to avoid punch-through. Advantageously, the threshold voltage is low due to the lightly doped P body region and the device has an on-state specific resistance similar to that of the ACCUFET and superior to that of the INVFET or EXTFET.

BRIEF DESCRIPTION OF THE DRAWINGS

Similar reference numbers herein in various figures refer to identical or similar structures.

DETAILED DESCRIPTION OF THE PREFERRED EMBODIMENTS

Figure 3:
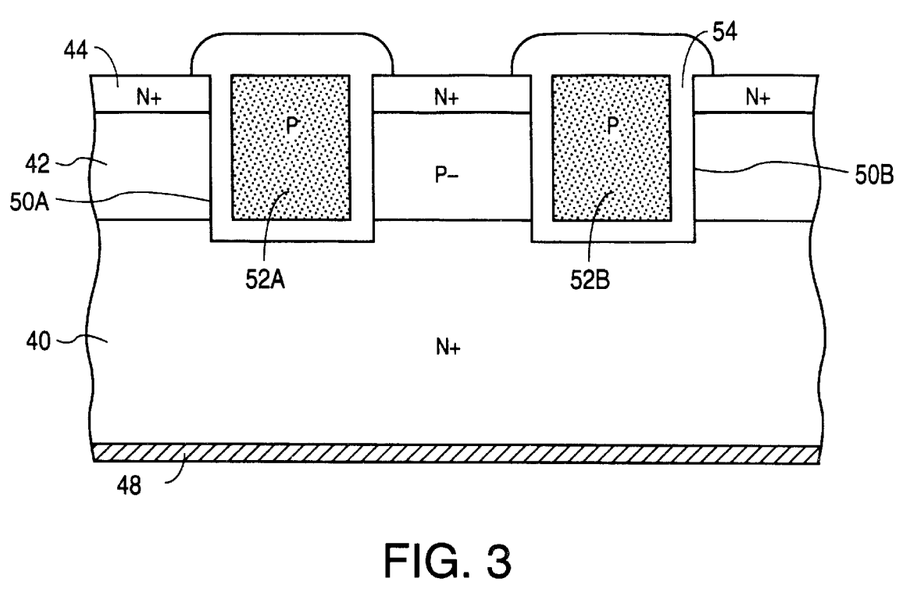
FIG. 3 shows an N-channel PT-FET in accordance with the present invention.

FIG. 3 shows a cross section (not to scale) of a portion of a trenched N-channel PT-FET in accordance with the present invention. It is to be understood that FIG. 2, like the other figures herein, is not to scale and that furthermore the various doped semiconductor regions shown herein, which are illustrated as precisely defined regions delineated by borderlines, are conventional representations of doped regions having in reality gradient dopant levels at their edges. Moreover, as is well known in the art and as described further below, typically power MOSFETs include a large number of cells, the cells having various shapes such as square, circular, hexagonal, linear or others. These cells are evident in a top side view, several of which are provided below. In terms of cell layout, the PT-FET is conventional and may be fabricated in any one of a number of well known cell structures. The present illustrations are therefore typically of only one cell or a portion of two cells as delineated by the gate trenches, and are not intended to illustrate an entire power transistor which would typically include hundreds or thousands of such cells.

Moreover, certain well known elements of such trenched MOSFETs are not shown in certain of the present drawings. For instance, the metallization which connects to the gate electrodes is typically not shown as being outside the plane of the present cross sectional drawings. Also, the termination portions of the transistors are only shown in certain of the drawings below; in others the termination portions are outside the area depicted in the drawings.

FIG. 3 shows one embodiment of an N-channel PT-FET including a drain (substrate) region 40 which is N+ doped to have a resistivity of e.g. 0.002 Ω-cm. Formed immediately over the drain region 40 is a P– doped body region 42 having a doping concentration in the range of e.g. $10^{14}$ to $10^{16}/cm^3$ and a typical doping concentration of $10^{15}/cm^3$.

Overlying the body region 42 is the N+ doped source region 44 which is doped to a concentration of e.g. $2 \times 10^{19}/cm^3$. A conventional metallized drain contact 48 is formed the backside of the semiconductor substrate. Formed in the upper portion of the semiconductor structure are trenches 50A, 50B, which respectively hold P+ doped polysilicon gate electrodes 52A, 52B which are each doped P-type to a maximum attainable value. (It is to be understood that gate electrodes 52A, 52B are connected to each other outside the plane of the drawing). Each trench 50A, 50B is lined with gate oxide layer 54 e.g. 500 Å thick (a typical range is 400 to 800 Å) to insulate the polysilicon gate electrodes from the silicon sidewalls and bottom of the trenches 50A, 50B.

Not depicted in this illustration are the passivation layer (typically boro-phosphosilicate glass BPSG) and the top side source contact metallization. In this case the body region 42 is a "floating region", having no electrical contact made thereto. This structure has been found especially suitable for high current, low voltage switching applications, i.e. less than 25 volts.

Figure 4A:
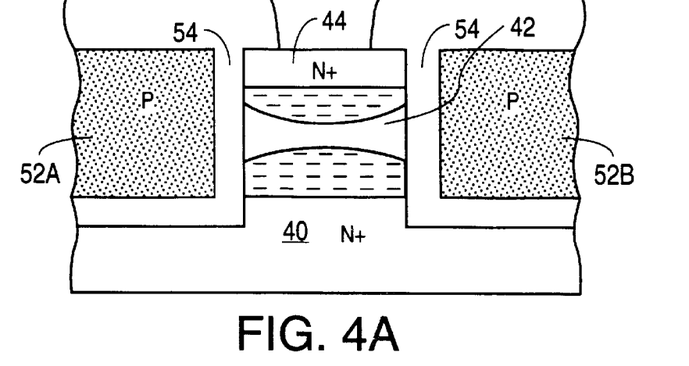
FIG. 4A shows operation of the present PT-FET in equilibrium.
Figure 4B:
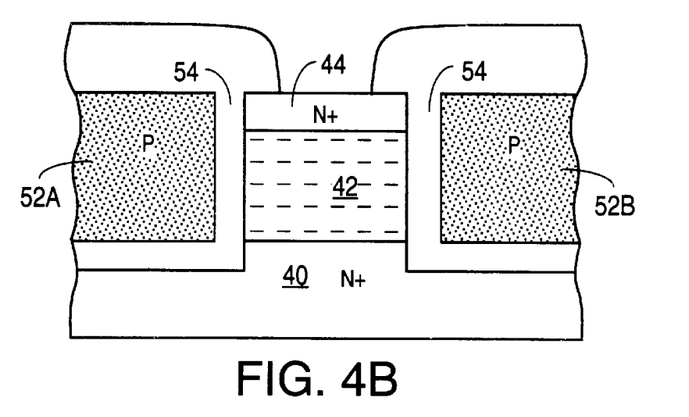
FIG. 4B shows operation of the present PT-FET in the blocking (off) state with an applied drain-source voltage.
Figure 4C:
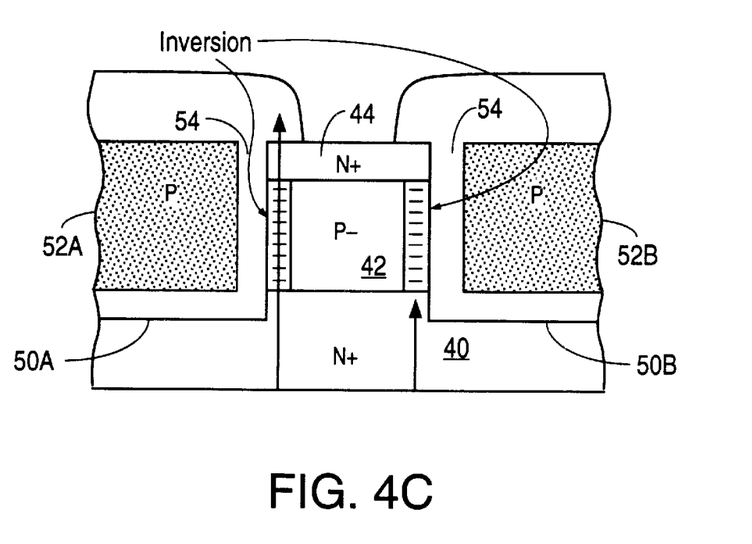
FIG. 4C shows operation of the present PT-FET in the on state.

The principle of operation of this device is illustrated in FIGS. 4A, 4B and 4C. FIG. 4A illustrates equilibrium, and FIG. 4B illustrates operation in the blocking (off) state. Thus the gate-source bias voltage ($V_{gs}$) is equal to zero in both FIGS. 4A and 4B. In the blocking state the drain-source voltage ($V_{ds}$) is greater than or equal to zero, since operation of the device of FIG. 3 is bidirectional. FIG. 4A illustrates the body depletion for the situation where the drain-source voltage is equal to zero. (It is to be understood that there is plus (+) charge depletion in the N+ source and drain regions which is not drawn for simplicity.) This is an equilibrium state in terms of the charge distribution, as shown in FIG. 4A.

In FIG. 4B, the drain-source voltage is greater than zero while the gate-source voltage is still equal to zero. In this case the body region is fully depleted. The leakage current is controlled by an electron energy barrier formed within the body depletion region as shown. The leakage current is reduced to acceptably low levels (e.g., 1% of that of an ACCUFET) by the P-doped polysilicon gate electrodes 52A, 52B. It has been found by the present inventors that a P-type polysilicon gate electrode for an N-channel device (that is, the polysilicon gate electrode having the same conductivity type as the adjacent body region) is highly beneficial. The P-type polysilicon gate electrode allows the body region to remain fully depleted while it enhances the energy barrier to reduce leakage to acceptable levels (levels superior to those of the ACCUFET).

Thus majority carrier current flow is provided without any deleterious PN junction behavior. There is also no need to short the source region 44 to the body region 42, hence allowing bidirectional operation of the PT-FET. Thus the gate control of the barrier allows low current leakage, superior to that of the prior art ACCUFET, because the barrier is larger due to the doping type of the lightly doped body region 42.

FIG. 4C illustrates the on state conduction which is typically the situation with the gate-source voltage being greater than the transistor threshold voltage and the drain-source voltage is greater than zero.

In this case as shown the inversion regions are along the trench 50A, 50B side walls which conduct majority carrier through the inversion region. Current flow takes place when the drain-source voltage is greater than zero, in the direction shown by the arrow. Advantageously the lightly doped body region 42 allows a low threshold voltage, while in addition the on-state specific resistance is superior to that of the INVFET or the EXTFET, and comparable to that of the ACCUFET.

Figure 5:
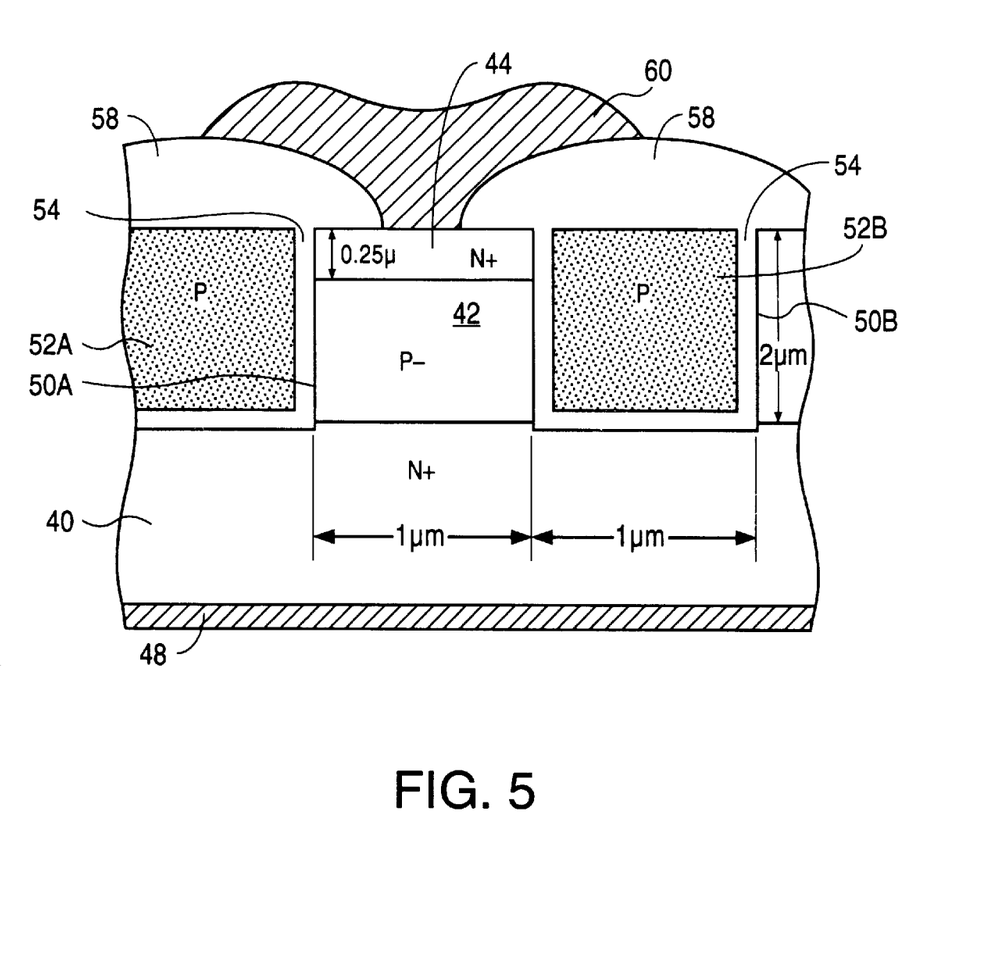
FIG. 5 shows dimensions and further detail of one embodiment of a PT-FET.

FIG. 5 shows additional detail of an N channel PT-FET which is otherwise similar to that of FIGS. 3 and 4. Also illustrated in FIG. 5 is the conventional (passivation) layer 58 which is BPSG overlying each polysilicon gate electrode, and the metal, e.g. aluminum, source contact. Also shown in FIG. 5 are exemplary dimensions for the gate oxide 54 thickness (500 Å) and the source region 44 thickness (0.25 $\mu$m). The typical trench 50A, 50B depth is 2.1 $\mu$m, which extends through the source region 44 and body region 42 and partially into the substrate region 40. An exemplary thickness of the substrate (drain region 40) is 500 $\mu$m.

As illustrated, the mesa (the silicon between two adjacent gate trenches) is e.g. 1 $\mu$m (under 1.5 $\mu$m) in width while each trench 50A, 50B is 1 $\mu$m (under 1.5 $\mu$m) in width, thus allowing an exemplary 2 $\mu$m to 3 $\mu$m pitch per cell.

Figure 6:
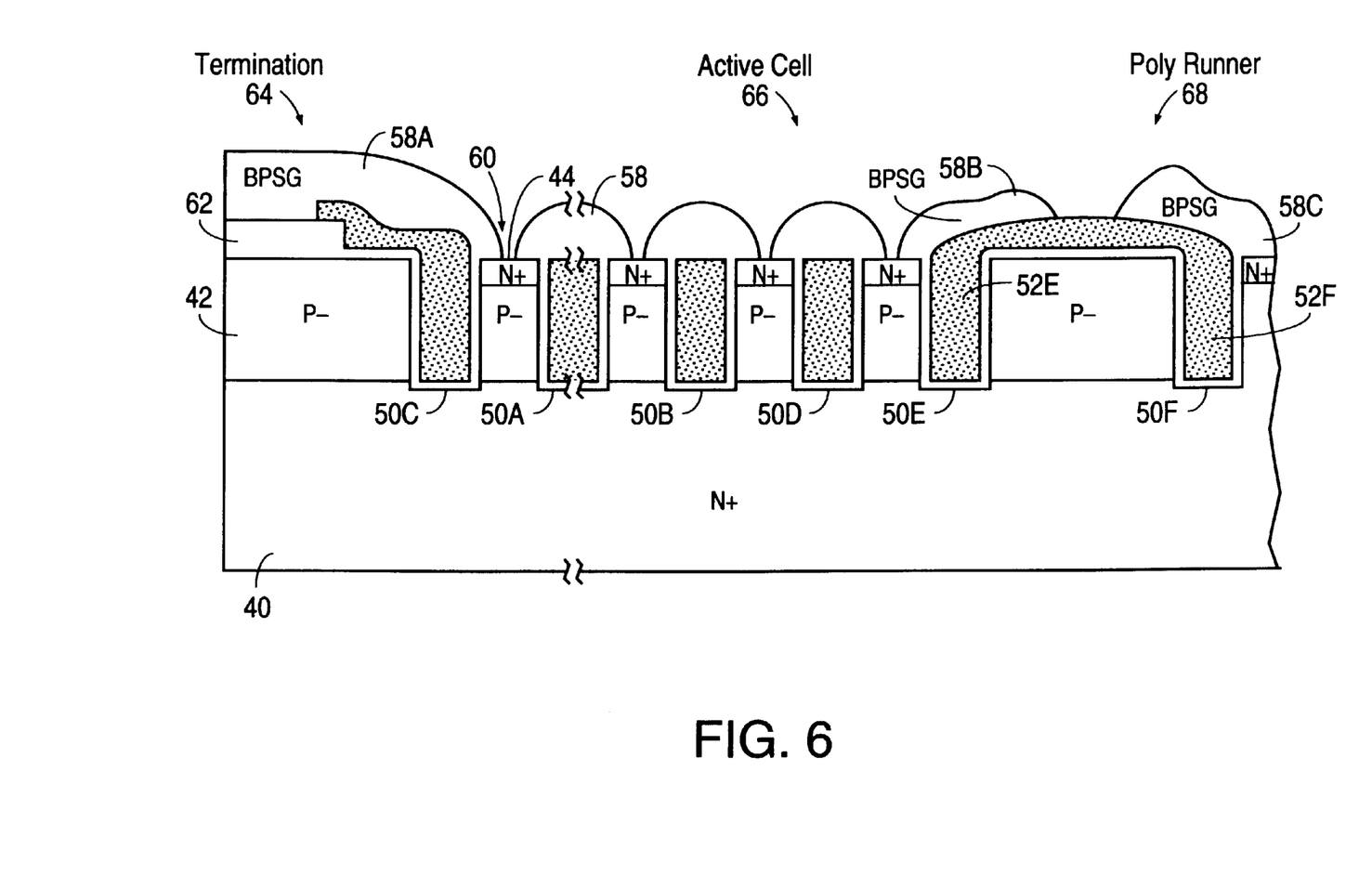
FIGS. 6, 7 and 8 show three termination and poly runner structures suitable for use with the present PT-FET.

FIGS. 3, 4 and 5 each only illustrate one cell or a portion of two cells in the active portion of a typical multi-cell PT-FET. FIG. 6 illustrates a first embodiment of a PT-FET with at the left side a termination region 64. At the right side is a "poly runner" region 68 for contacting low-resistivity metal (not shown) to the relatively higher resistivity gate electrode material. FIG. 6 shows a number of cells (additional cells are omitted, as suggested by the broken lines) in the active region of the device. The left side termination region 64 includes, adjacent the leftmost trench 50C, the absence of any N+source region. Also present in termination region 64 is a BPSG layer 58A. Source contact 60 is located between BPSG portions 58A, 58. In the right side poly runner region 68 (mesa), again there is no source region to the right of trench 50E. This mesa provides a wide contact region for running metallization to select regions of polysilicon for the purpose of lowering total gate resistance. Also shown in FIG. 6 is field oxide region 62 in termination region 64, underlying BPSG layer 58A. Optionally the field oxide is also present in the poly runner region 68. Polysilicon structure 52F includes a gate runner to the polysilicon gate electrode 52E of the adjacent cell in trench 50E.

Figure 7:
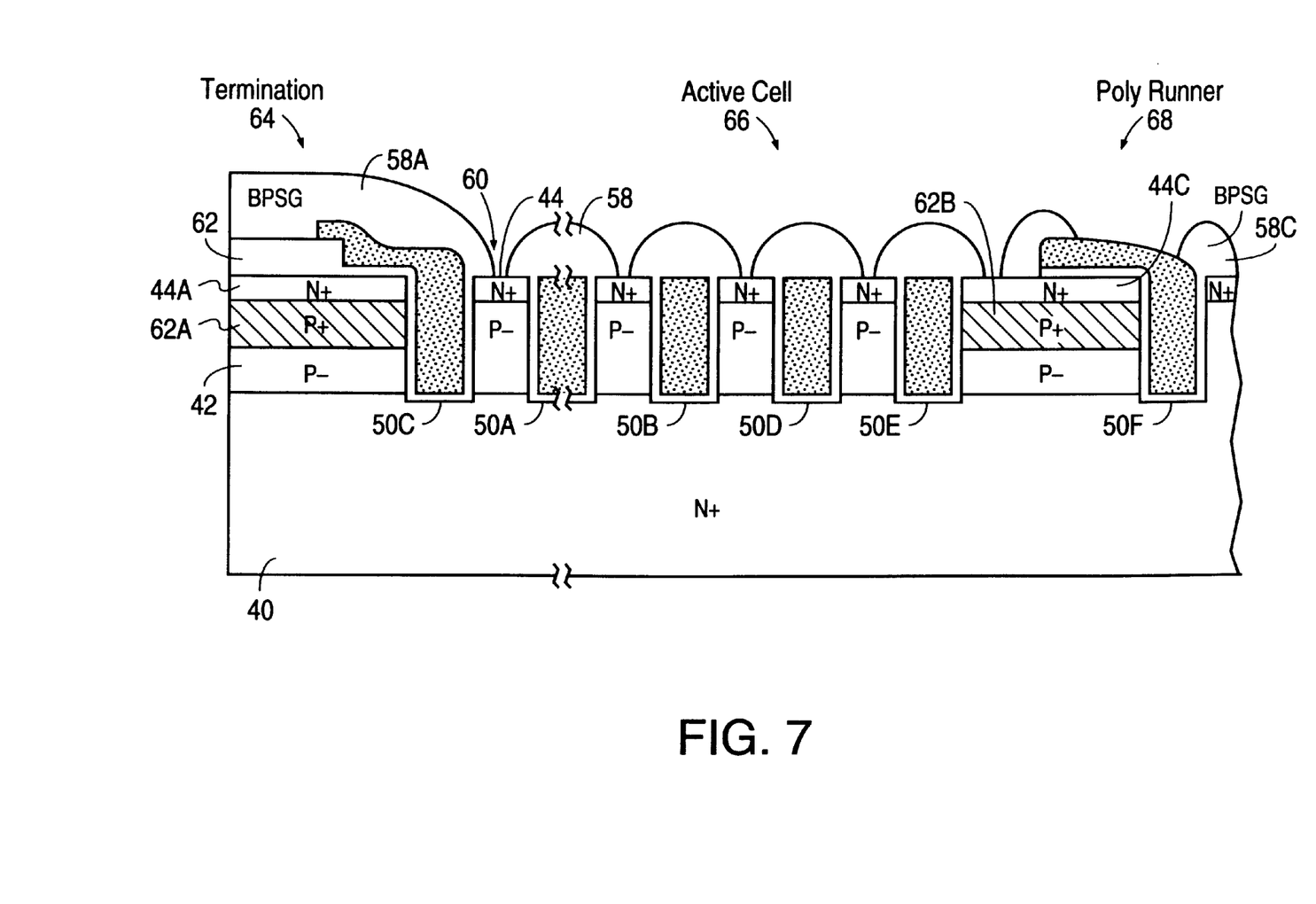

FIG. 7 shows a second PT-FET having a termination region and poly runner region which differ from those of FIG. 6 in two ways. First, P+ regions 62A, 62B are provided in both the left side termination and right side poly runner regions 64, 68. These P+ regions 62A, 62B prevent leakage in the relatively wide poly runner region 68 and prevent inversion in both the termination 64 and poly runner regions 68.

Additionally, the N+ source regions 44A, 44B are present respectively in the termination and poly runner regions. In this case the polysilicon ("poly") runner in the right side poly runner region 68 extends over to contact the N+ region 44B in the poly runner region 68, with a contact 60B made to that N+ region for purposes of electrostatic (ESD) robustness.

Figure 8:
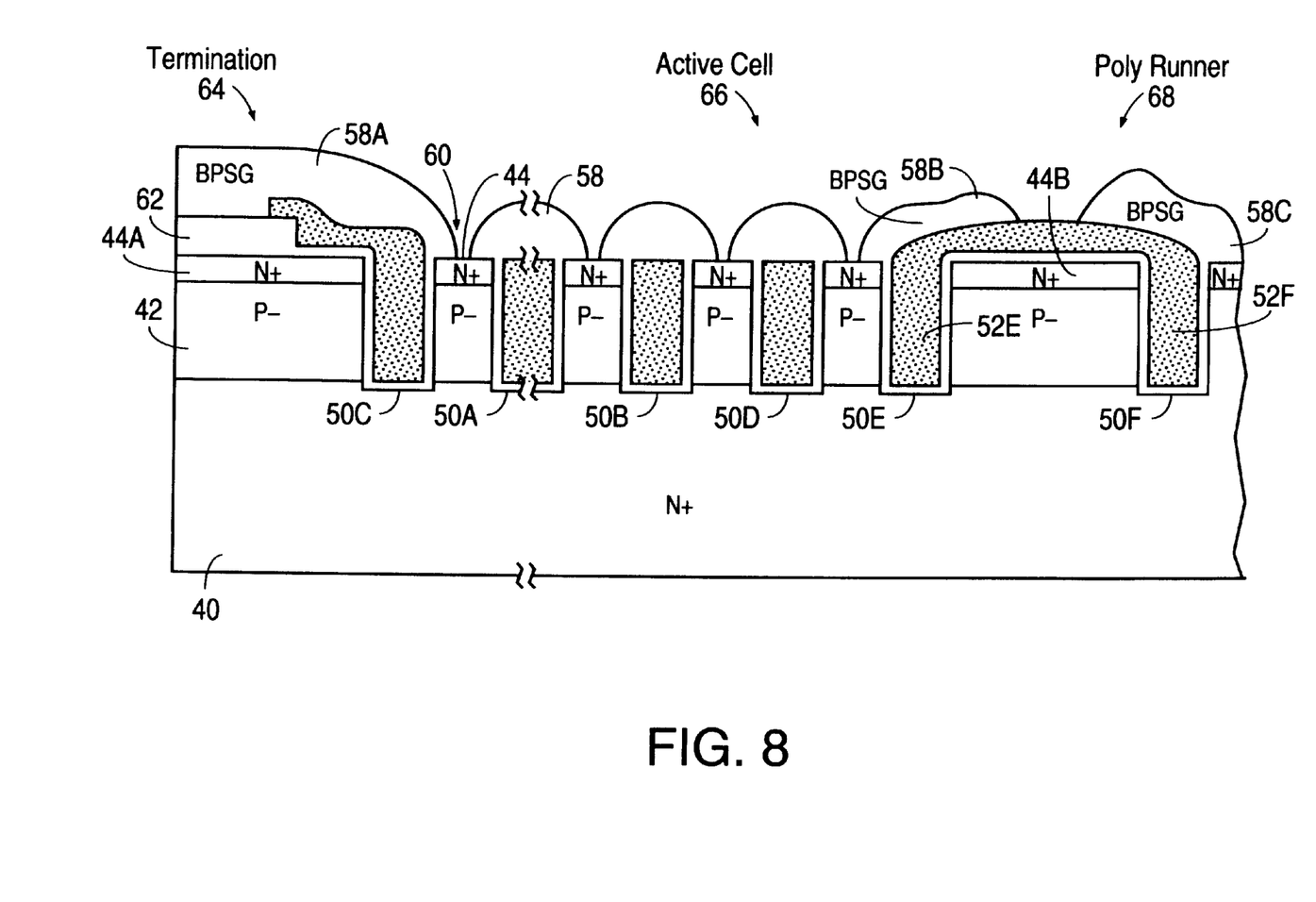

FIG. 8 shows a third PT-FET similar to that of FIG. 7 in having the N+ regions 44A, 44B respectively in the termination and poly runner regions, but not having a P+ region in the termination or poly runner regions. Additionally the N+ region 44B in the right side poly runner region 68 does not have an exterior metallized contact (is floating) to prevent leakage in the relatively wide mesa region. FIG. 8 is similar to FIGS. 6 and 7 in that polysilicon structure 52F includes a runner to the gate electrode 52E in adjacent trench 50E.

Figure 9A:
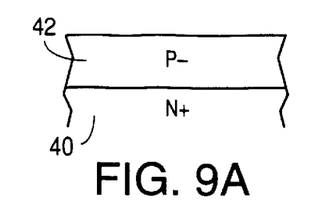
FIGS. 9A, 9B and 9C show process steps to fabricate a PT-FET in accordance with the present invention.
Figure 9B:
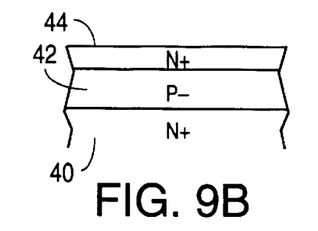
Figure 9C:
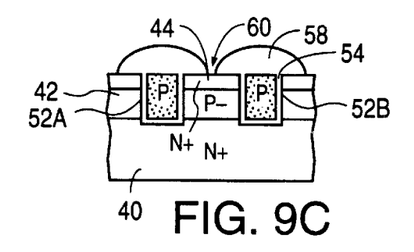

A process for fabricating an N-channel PT-FET is illustrated in FIGS. 9A through 9C. Beginning in FIG. 9A, an N+ doped silicon substrate 40 (having a resistivity e.g. 0.001 –0.005 $\Omega$-cm) is provided, on which is grown epitaxially a lightly doped P– region 42 having a doping concentration of $10^{15}$/cm$^3$ which becomes the body region. A typical final thickness of this P-epitaxial layer 42 after all processing is 2 $\mu$m.

Then in several steps shown in FIG. 9B, an active region mask (not shown) is formed over the principal surface of the epitaxial layer 42 to pattern the field oxide in the termination region and optionally in the poly runner region. The active region mask patterns the field oxide in the termination region and opens the areas for active cells. Next a source mask is formed and patterned, and then through the openings in the source mask the N+ source region 44 is implanted and diffused to a thickness (depth) of approximate 0.25 $\mu$m and a final surface doping concentration of e.g. 2×10$^{19}$/cm$^3$. The N+ source region 44, due to the source region mask, is not implanted in the termination 64 and poly runner regions 68 (as shown in FIG. 6 for instance) in some embodiments. In the embodiments of FIGS. 7 and 8 the N+ source region implant is a maskless step which occurs before the field oxide/active mask steps. In the embodiment of FIG. 6, the source region implant occurs after the active mask steps.

Then in several steps in FIG. 9C, the upper surface of the P-doped epitaxial layer 42 is masked and the mask is patterned to define the trench locations. The trenches are then conventionally anisotropically etched by e.g. dry etching to a depth of approximately 2.1 $\mu$m.

After the trenches are etched, a gate oxide layer 54 e.g. 500 Å thick (in a range of 400 to 800 Å) is formed lining the trenches and over the entire surface of the epitaxial layer 42.

Then a layer of polysilicon is deposited filling the trenches and over the entire surface of the epitaxial layer. The polysilicon is then heavily doped with a P type dopant before it is patterned. A mask is then applied to the upper surface of the polysilicon and the mask is patterned and the polysilicon etched to define the gate electrodes and the polysilicon runners (as described above) connecting the gate electrodes.

In the embodiment of FIG. 7, the P+ region 62A, 62B is implanted using a mask by e.g. a high energy implant, either before or after the trenches are etched and filled.

After patterning of the polysilicon gate structures 52A, 52B, a layer of BPSG 58 is formed thereover and subsequently patterned using a mask to define the contact openings to the silicon surface.

Then the metallization layer is deposited and conventionally patterned using a mask. Then conventionally a final e.g. PSG or nitride passivation layer (not shown) is formed and masked to define the contact pads.

Figure 10A:
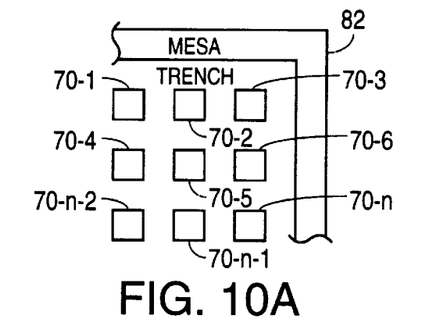
FIGS. 10A and 10B show two top side layouts for a PT-FET.

FIG. 10A illustrates a top side view of a portion of the PT-FET in accordance with one embodiment. In this case the cells are rectangular and isolated by the trenches, the small rectangles being the source regions 70-1 . . ., 70-n. Hence the trenches are formed in a criss-cross pattern to define the rectangular cells. The mesa region 82 surrounding the cells is the termination region as in FIGS. 6–8.

Figure 10B:
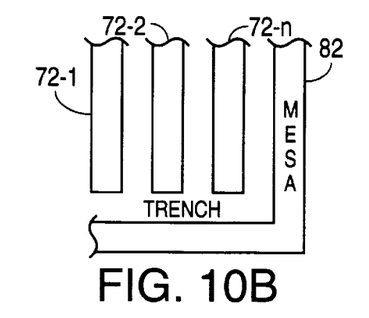

FIG. 10E shows alternatively a linear cell type arrangement where the trenches, while criss-crossing, have a different spacing in the left-right direction than they do in the vertical direction in the drawing. This represents a linear open-cell geometry with source regions 72-1, 72-2, . . ., 72-n each isolated by the trenches and termination mesa region 82.

Figure 11:
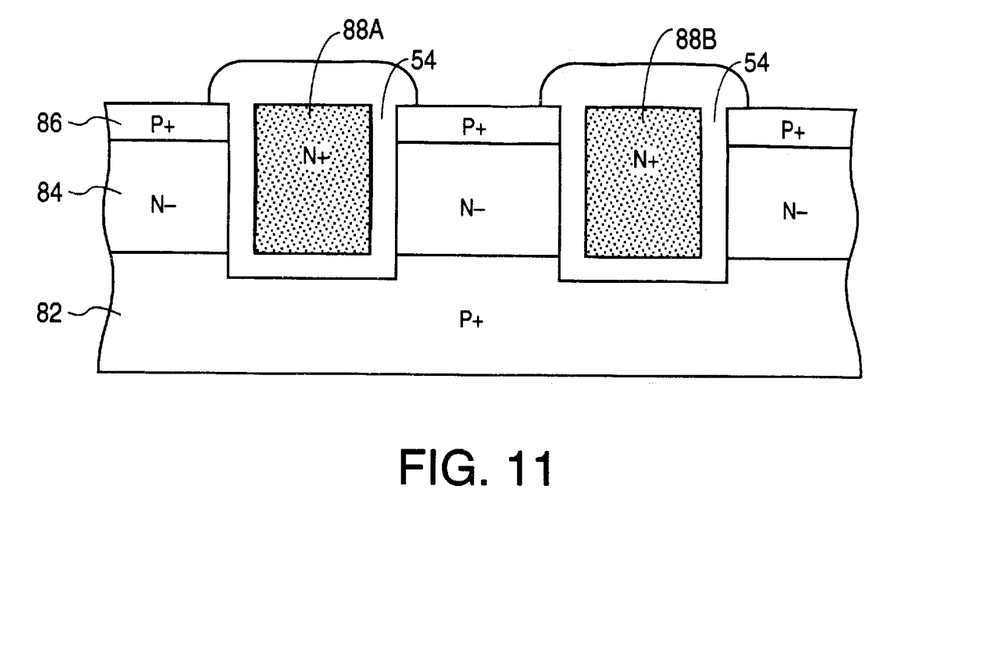
FIG. 11 shows a P-channel PT-FET.

FIG. 11 depicts the P-channel complement of the PT-FET of FIG. 3. This PT-FET has all conductivity types opposite to that of the PT-FET of FIG. 3. Shown are drain region 82, body region 84, source region 86, and N+ doped gate electrodes 88A, 88B. Similarly, in the termination region (not shown) the conductivity types are complementary to those of FIG. 3. The dimensions of the PT-FET of FIG. 11 would be similar to those of FIG. 5, as is the doping concentration for each particular region within well known material constraints.

Figure 12:
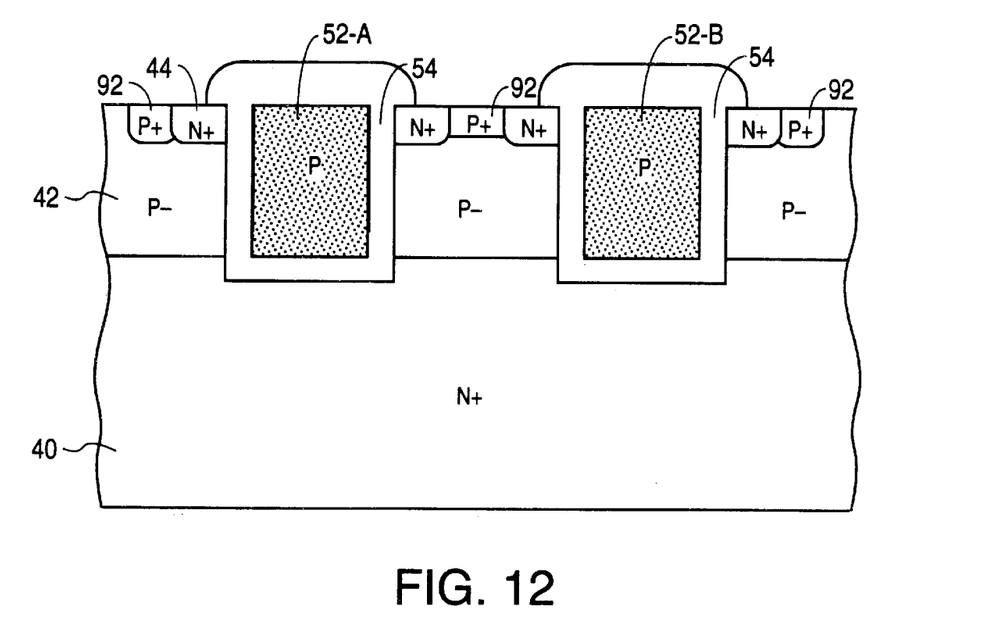
FIG. 12 shows another embodiment of a PT-FET with a body contact region and the body region shorted to the source.

FIG. 12 shows another embodiment of an N-channel PT-FET which in most respects is identical to that of FIG. 3, but has the addition of a P+ doped body contact region 92 formed in an upper portion of the semiconductor structure. This allows, via a conventional source-body contact (not shown in FIG. 12), the shorting of the source region 44 to the body region 42. This prevents bidirectional operation and so provides a device which operates with forward conductivity only.

The above description is illustrative and not limiting; further modifications will be apparent to one skilled in the art in light of this disclosure and are intended to fall within the scope of the appended claims.

We claim:

1. A method of forming a semiconductor device, comprising the steps of:

providing a semiconductor substrate doped to have a first conductivity type and of uniform doping concentration;

epitaxially forming a body layer doped to have a second opposite conductivity type directly on an upper surface of the substrate, wherein a doping concentration of the body layer is less than $10^{16}/cm^3$;

forming a source region doped to have the first conductivity type in an upper portion of the epitaxial body layer;

forming a trench extending through the source region into the body layer;

forming a polycrystalline silicon structure in the trench;

doping the polycrystalline silicon structure to the second conductivity type; and forming a drain electrode directly on a lower surface of the substrate.

2. The method of claim 1, further comprising the steps of:

forming a second trench extending through the source region into the body layer;

forming a second polycrystalline silicon structure in the trench; and doping the second polycrystalline crystal structure to the second conductivity type;

wherein the second trench is laterally spaced apart from the first trench by less than 1.5 μm.

3. The method of claim 1, wherein a doping concentration of the body layer is in a range of $10^{14}$ to $10^6/cm^3$.

4. The method of claim 1, wherein the source region overlies all of the body layer and thereby the body layer is electrically floating, and thereby not in electrical contact with any structures except the source region and semiconductor substrate.

5. The method of claim 1, further comprising the step of forming a body contact region of the second conductivity type in the body layer and laterally adjacent the source region.

6. The method of claim 5, further comprising the step of forming a body electrode in contact with the body contact region.

7. The method of claim 1, further comprising the step of forming a second doped polycrystalline silicon structure in the substrate and laterally spaced apart from the doped polycrystalline silicon structure by less than 1.5 μm.

8. The method of claim 1, wherein a total thickness of the source region and body layer is 2 μm.

9. The method of claim 1, wherein the doped polycrystalline silicon structure has a lateral width of less than 1.5 μm.

10. The method of claim 1, wherein the doped polycrystalline silicon structure in the trench extends into the substrate.

11. The method of claim 1, further comprising the steps of:

forming a trench extending into the body layer and spaced apart from the source region, thereby being in a termination region of the semiconductor device; and forming a conductive structure in the trench and laterally surrounding the source region and extending over a principal surface of the body layer.

12. The method of claim 11, further comprising the steps of:

forming an additional trench into the body layer and spaced apart from the source region, thereby being in a runner region of the semiconductor device; and forming a conductive structure in the additional trench and over a principal surface of the body layer, and being in contact with the doped polycrystalline silicon structure.

13. The method of claim 12, wherein the termination region and runner region each further includes a doped region of the second conductivity type and being more heavily doped than the body layer and overlying the body layer in respectively the termination region and the runner region.

14. The method of claim 13, wherein a doping level of the doped region in the termination region and in the runner region is in a range of $10^{17}$ to $10^{19}/cm^3$.

* * * * *